United States Patent
Kim et al.

(10) Patent No.: US 7,242,035 B2
(45) Date of Patent: Jul. 10, 2007

(54) SIDE VIEW LED PACKAGE HAVING LEAD FRAME STRUCTURE DESIGNED TO IMPROVE RESIN FLOW

(75) Inventors: Chang Wook Kim, Kyungki-do (KR); Young Jae Song, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 11/319,100

(22) Filed: Dec. 28, 2005

(65) Prior Publication Data
US 2006/0170083 A1   Aug. 3, 2006

(30) Foreign Application Priority Data
Jan. 28, 2005   (KR) .................. 10-2005-0008218

(51) Int. Cl.
  *H01L 29/22*    (2006.01)
  *H01L 21/00*    (2006.01)
(52) U.S. Cl. .................. 257/99; 257/100; 257/676; 257/667; 438/25; 438/26; 438/27

(58) Field of Classification Search .................. 257/99, 257/100, 676, E25.032, 667; 438/25, 26, 438/27, 28
See application file for complete search history.

(56) References Cited

U.S. PATENT DOCUMENTS

2004/0135156 A1* 7/2004 Takenaka .................. 257/79
2005/0141584 A1* 6/2005 Ohe et al. .................. 372/108

* cited by examiner

*Primary Examiner*—Long K. Tran
(74) *Attorney, Agent, or Firm*—Lowe Hauptman & Berner (57) ABSTRACT

The invention relates to a side view LED package in use with an LCD backlight unit. The side view LED package comprises: an LED chip; and a strip-shaped lead frame having a toothed structure formed in a lateral edge thereof. The LED chip is mounted on a surface of the lead frame. An integral package body is made of resin, and includes a hollow front half having a cavity for housing the LED chip and a solid rear half divided from the front half by the lead frame. The toothed structure of the lead frame structure can improve resin flow in order to ensure stability even if the LED package is made extremely thin.

11 Claims, 6 Drawing Sheets

PRIOR ART

FIG. 3

PRIOR ART

SIDE VIEW LED PACKAGE HAVING LEAD FRAME STRUCTURE DESIGNED TO IMPROVE RESIN FLOW

CLAIM OF PRIORITY

This application claims the benefit of Korean Patent Application No. 2005-8218 filed on Jan. 28, 2005, in the Korean Intellectual Property Office, the disclosure of which is incorporated herein by reference.

BACKGROUND OF THE INVENTION

1. Field of the Invention

The present invention relates to a side view Light Emitting Diode (LED) package in use with an LCD backlight unit. More particularly, the invention relates to a side view LED package having a lead frame structure designed to improve resin flow in order to ensure stability even if the LED package is made extremely thin.

2. Description of the Related Art

Side view LEDs are widely used as a light source of a backlight unit of a small-sized LCD in a mobile phone, a Personal Digital Assistant (PDA) and so on. The side view LEDs are used in a package, in which their mounting height is getting gradually reduced and it is expected that a dimension of 0.5 mm or less will be required. Furthermore, the LED package should ensure high reliability while realizing high brightness by minimizing light loss and so on.

At present, in order to reduce the thickness of the side view LED package, endeavors have been made to reduce the thickness of upper and lower wall parts around an LED window. However, reducing the wall part thickness is extremely difficult task. This task also potentially weakens wall strength thereby failing to ensure reliability.

Figure 1:
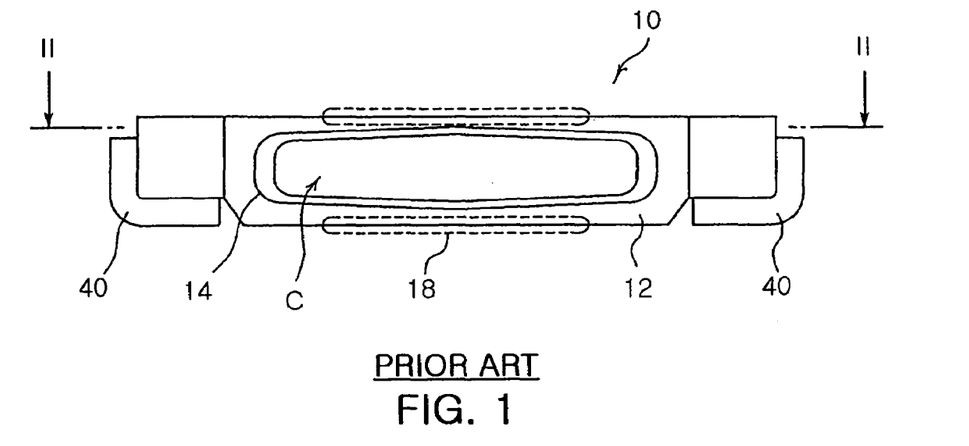
FIG. 1 is a front elevation view of a general side view LED package.
Figure 2:
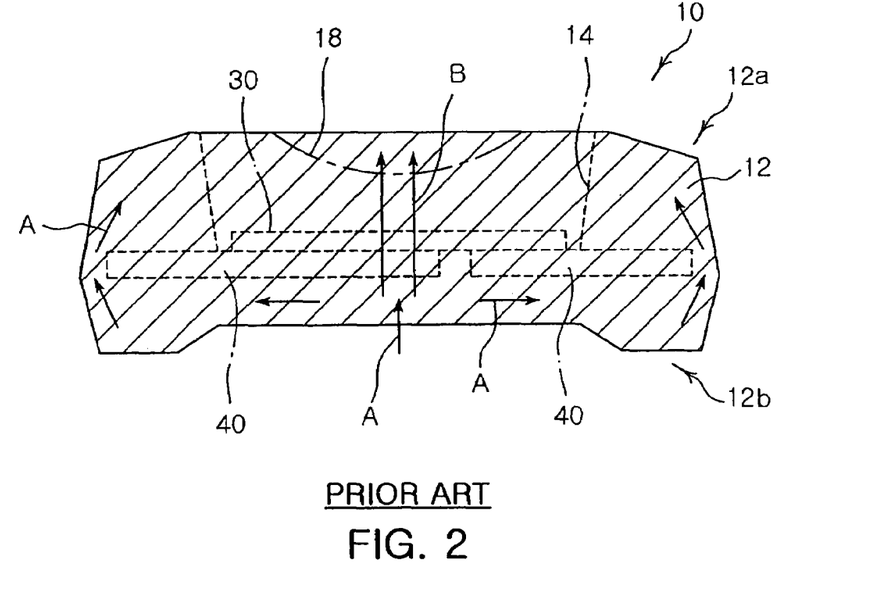
FIG. 2 is a cross-sectional view illustrating resin flow on a plane taken along the line II—II in FIG. 1.
Figure 3:
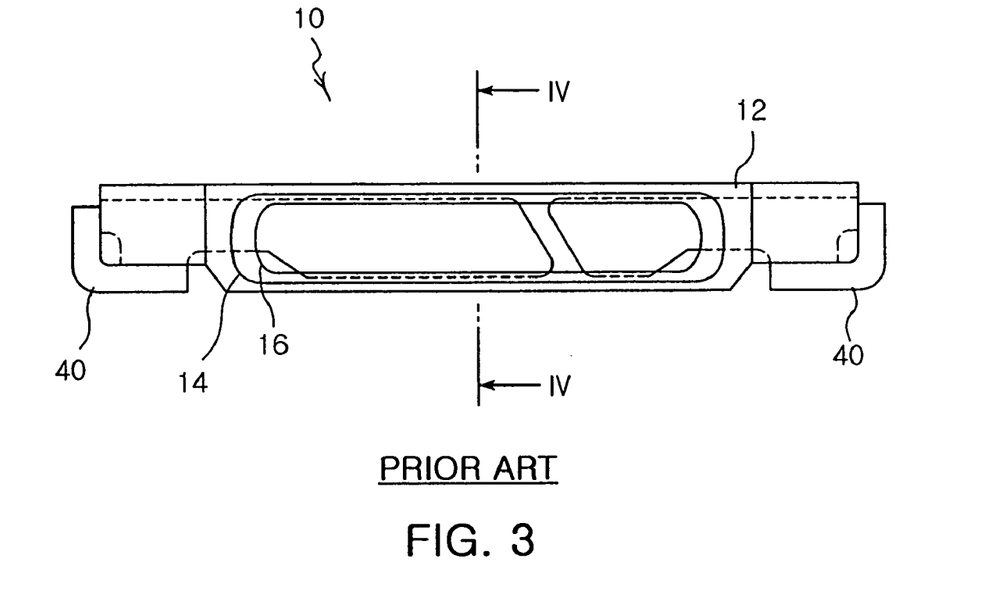
FIG. 3 is front elevation view of a side view LED package having lead frames of the prior art.
Figure 4:
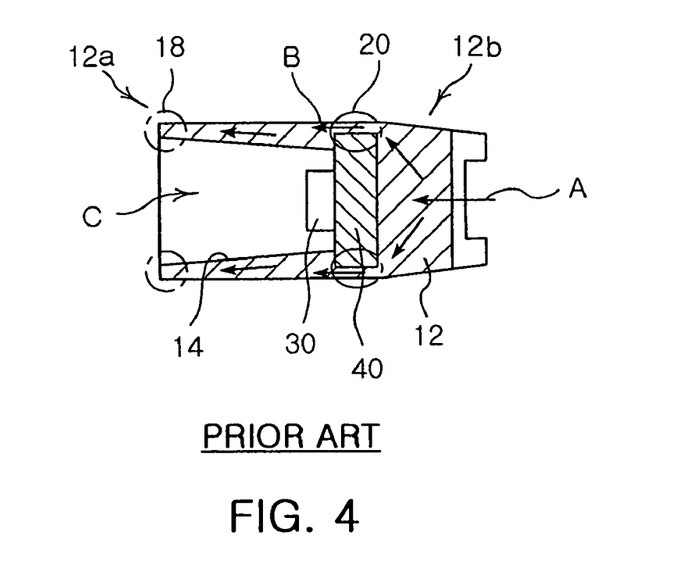
FIG. 4 is a cross-sectional view illustrating resin flow on a plane taken along the line IV—IV in FIG. 3.

This will be described in more detail with reference to FIGS. 1 to 4, in which FIG. 1 is a front elevation view of a general side view LED package, FIG. 2 is a cross-sectional view illustrating resin flow on a plane taken along the line II—II in FIG. 1, FIG. 3 is front elevation view of a side view LED package having lead frames of the prior art, and FIG. 4 is a cross-sectional view illustrating resin flow on a plane taken along the line IV—IV in FIG. 3.

First, strip-shaped lead frames 40 are disposed in a mold as shown in FIG. 2, and resin is injected into the mold, such that resin forms a body 12 and a wall 14 surrounding a cavity C of an LED package 10 during the flow along the direction of arrow A. Resin spreads laterally in a rear half 12b of the body 12 about lead frames 40, and then directs toward a front half 12a of the body 12. In the meantime, upper and lower wall parts of the front half 12a of the body 12 are formed of resin that flows over the lead frame 40 as indicated with arrow B.

As shown in FIGS. 2 and 3, the lead frames 40 are placed along substantially the entire length of the LED package 10, with a width larger than that of the bottom 16 of the cavity C. That is, as shown in FIG. 4, the lead frames 40 are spaced from the outside surface of the body 12 at a small gap 20, which acts as a bottleneck. Therefore, it is apparent that resin does not smoothly flow along the direction of arrow B.

Then, resin insufficiently feeds to central leading ends of the upper and lower wall parts 18, thereby creating molding defects such as V-shaped voids.

In particular, since the LED package is getting longer in reverse proportion to its thickness reduction, the central leading ends of the wall parts 18 become more susceptible to molding defects.

In the meantime, heat generated from the operation of the LED chip 30 expands the lead frames 40 inside the LED package 10 along the length of the package 10. However, the lead frames 40 having different expansion coefficient from the package body 12 and an encapsulant inside the cavity C causes stress to the whole LED package 10 including the lead frames 40.

Figure 5:
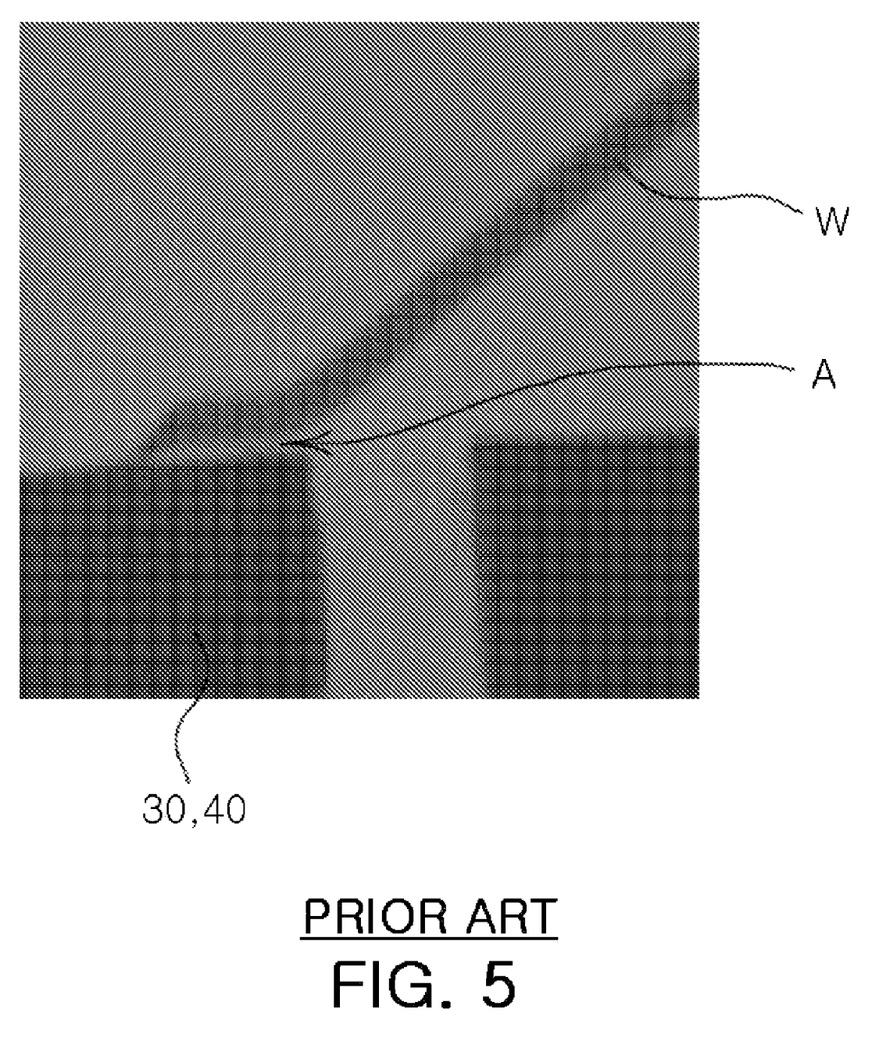
FIG. 5 is a photograph illustrating disconnection in a bonding area of a lead frame of the prior art.

Such stress if repeated or continued may cause the lead frames 40 to get loose or separated from the package body 12 to such an extent that a disconnection A takes place between a wire W and a lead frame 40 or between the wire W and an LED chip 30 as shown in FIG. 5.

These problems are getting more serious according to the reduced thickness of the LED package 10 accompanied with its increased length.

SUMMARY OF THE INVENTION

The present invention has been made to solve the foregoing problems of the prior art and it is therefore an object of the present invention to provide a side view LED package having a lead frame structure designed to improve resin flow in order to ensure stability even if the LED package is made extremely thin.

It is another object of the invention to provide a side view LED package having a lead frame structure designed to ensure stability for internal electrical connection under high temperature-induced stress.

According to an aspect of the invention for realizing the object, there is provided a side view LED package comprising: an LED chip; a strip-shaped lead frame having a toothed structure formed in a lateral edge thereof, the LED chip mounted on a surface of the lead frame; and an integral package body made of resin, and including a hollow front half having a cavity for housing the LED chip and a solid rear half divided from the front half by the lead frame.

Preferably, the toothed structure of the lead frame forms a resin flow passage promoting resin to flow from the rear half to the front half of the package body. In this case, the resin flow passage may be configured to promote resin flow along a wall of the cavity from both lateral edges of the lead frame to the front half of the package body.

Preferably, the toothed structure of the lead frame may comprise a groove formed in the lateral edge of the lead frame to expose a bottom of the cavity.

In this case, the groove in the lateral edge of the lead frame may be formed to such an extent that the bottom of the cavity does not directly contact the LED chip. Also, the groove in the lateral edge of the lead frame may be formed along a major part of the lead frame edge in the cavity to such an extent that a portion of the lead frame edge inserted into a wall of the cavity stably supports the lead frame. Then, a remaining part of the lead frame in the cavity may have a width of at least 80% of the thickness of the lead frame.

Preferably, the toothed structure of the lead frame as described above may further comprise a groove or hole that is fully buried in the package body.

Furthermore, the toothed structure of the lead frame may be preferably formed by punching.

Preferably, the toothed structure of the lead frame may comprise a groove or hole that is fully buried in the package body. In this case, the toothed structure of the lead frame may comprise a groove caved into the lateral edge of the lead frame from an inside wall of the cavity.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Hereinafter preferred embodiments of the present invention will be described in detail with reference to the accompanying drawings.

Figure 6:
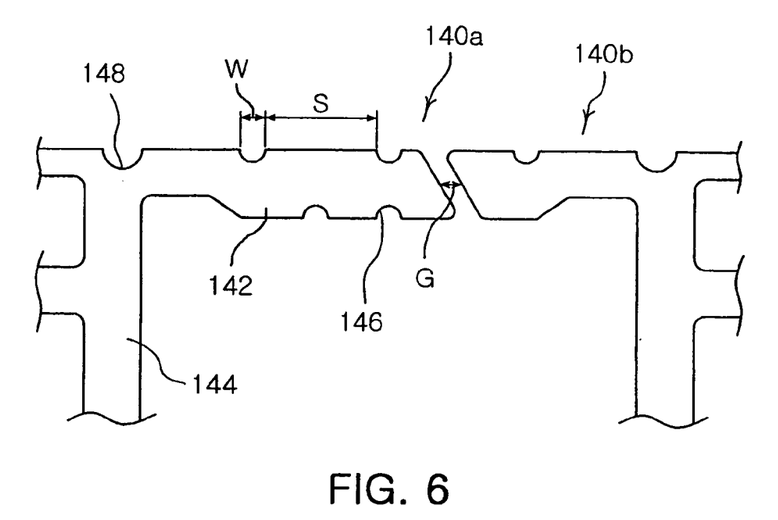
FIG. 6 is a plan view illustrating lead frames according to an embodiment of the invention, which are not mounted on an LED package.

FIG. 6 is a plan view illustrating lead frames of the invention, which are not mounted on an LED package.

Referring to FIG. 6, a pair of lead frames 140a and 140b according to a preferred embodiment of the invention shown in a plan view. The lead frames 140a and 140b are spread before being inserted into a mold to produce an LED package. When the lead frames 140a and 140b are inserted into the mold, external terminals 144 are folded about internal terminals 142.

The first and second lead frames 140a and 140b have a toothed configuration. That is, first resin flowing grooves 146 in the shape of semicircle are formed at both lateral edges of the strip-shaped internal terminal 142 of the first lead frame 140a, and a first resin flowing groove 146 in the same shape is formed at one lateral edge of the strip-shaped internal terminal 142 of the second lead frame 140b. The first resin flowing grooves 146 may have various shapes such as square, rectangle, triangle, semi-ellipse and slit.

The first resin flowing grooves 146 have a width corresponding to at least 80% of the thickness of the lead frames 140a and 140b. More preferably, the width of the first resin flowing grooves 146 is the same as or larger than the thickness of the lead frames 140a and 140b. The spacing S between the adjacent first resin flowing grooves 146 is preferably at least 80% of the thickness of the lead frames 140a and 140b, and more preferably the same as or longer than the thickness of the lead frames 140a and 140b.

When the first resin flowing grooves 146 are shaped as a slit (refer to FIG. 11), the width of the remaining internal terminal 142 is at least 80% of the thickness of the lead frames 140a and 140b, and preferably the same as or larger than the thickness of the lead frames 140 and 140b.

Furthermore, second resin flowing grooves 148 are formed in the shape of semicircle at joints of the internal terminals 142 to the external terminals 144. The second resin flowing grooves 148 may also have various shapes such as square, rectangle, triangle, semicircle, semi-ellipse and slit. The second resin flowing grooves 148 are preferably sized larger than the first resin flowing grooves 146. Alternatively, the second resin flowing groove 148 may be substituted with a hole. The hole may also have various shapes such as circle, rectangle, square and ellipse.

The width of the second resin flowing grooves 148 is preferably at least 80% of the thickness of the lead frames 140a and 140b, and more preferably the same as or larger than the thickness of the lead frames 140a and 140b.

The first and second resin flowing grooves 146 and 148 may be formed by various processes. For example, the resin flowing grooves 146 and 148 may be formed via punching while the lead frames 140a and 140b are fabricated. Alternatively, the grooves 146 and 148 may be formed by punching lead frames which have been prepared beforehand.

Figure 7:
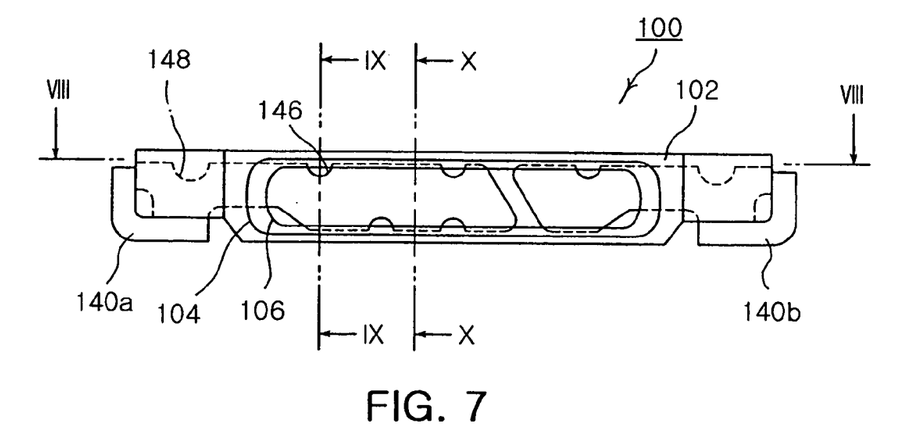
FIG. 7 is a front elevation view illustrating a side view LED package mounted with lead frames according to an embodiment of the invention.

The lead frame 140a is spaced from the lead frame 140b at a predetermined gap G, which is maintained also inside an LED package 100 as shown in FIG. 7.

Figure 8:
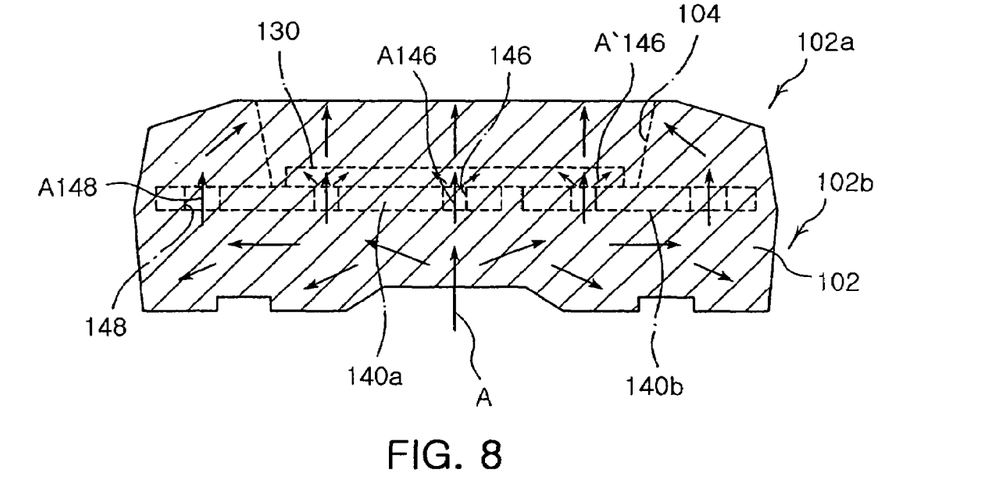
FIG. 8 is a cross-sectional view illustrating resin flow on a plane taken along the line VIII—VIII in FIG. 7.
Figure 9:
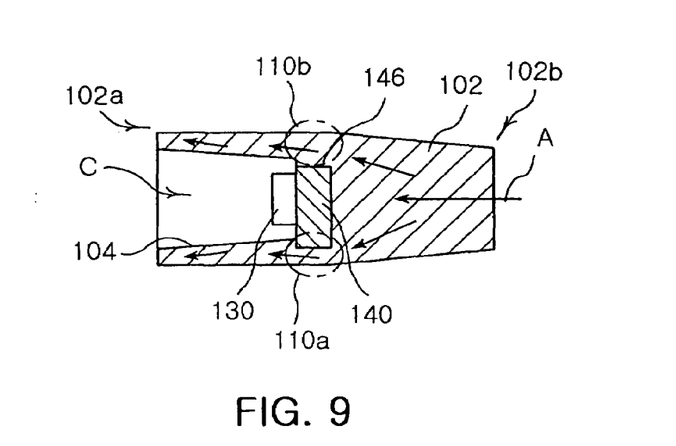
FIG. 9 is a cross-sectional view illustrating resin flow on a plane taken along the line IX—IX in FIG. 7.
Figure 10:
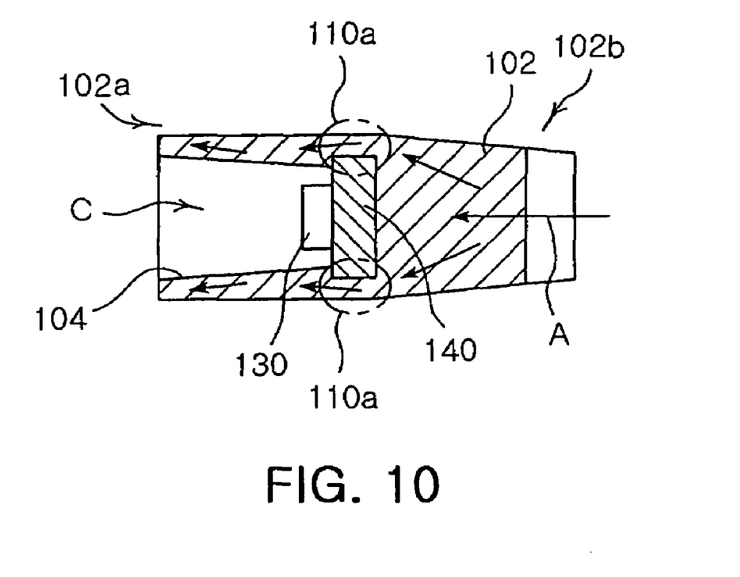
FIG. 10 is a cross-sectional view illustrating resin flow on a plane taken along the line X—X in FIG. 7.

Now the side view LED package having the lead frames 140a and 140b of FIG. 6 according to the invention will be described with reference to FIGS. 7 to 10, in which FIG. 7 is a front elevation view illustrating a side view LED package mounted with lead frames of the invention, FIG. 8 is a cross-sectional view illustrating resin flow on a plane taken along the line VIII—VIII in FIG. 7, FIG. 9 is a cross-sectional view illustrating resin flow on a plane taken along the line IX—IX in FIG. 7, and FIG. 10 is a cross-sectional view illustrating resin flow on a plane taken along the line X—X in FIG. 7.

Referring to the LED package 100 of the invention, a body 102 of resin includes a front half 102a and a rear half 102, which are divided from each other about the lead frames 140a and 140b. A wall 104 is formed at the periphery of the front half 102a, and a cavity C is formed surrounded by the wall 104. The cavity C is shaped to provide a space for mounting an LED chip 130 therein, and functions as an LED window for directing light generated by the LED chip 130 to the outside.

A plurality of LED chips may be mounted inside the cavity C. In this case, the reference sign 130 may indicate an LED chip mounting area.

Internal terminals (refer to 142 in FIG. 6) of the lead frames 140a and 140b are placed on the bottom 106 inside the cavity C, with the bottom 106 partially exposed as covered with the lead frames 140a and 140b.

The LED chip 130 can be mounted by flip chip bonding or wire boding. In case of flip chip bonding, the LED chip 130 is fixed and electrically connected to the lead frames 140a and 140b by solder bumps (not shown). In case of wire bonding, the LED chip 130 is bonded to the lead frames 140a and 140b by for example adhesive, and electrically connected thereto by wires (not shown).

Although not shown, transparent encaulant is filled in the cavity C to seal the LED chip 130, the lead frames 140a and 140b and electric-connector means such as solder bumps and wires as well as to protect these components from the external environment.

After being sealed, the lead frames 140a and 140b are fixed inside the body 102 with the predetermined gap G from each other. The first resin flow grooves 146 partially expose the bottom 106 adjacent to the wall 104 while the second resin flow grooves 148 are completely buried in lateral portions of the package body 102.

Such an LED package 100 is formed by mounting the lead frames 140a and 140b as in FIG. 6 into a mold and injecting resin into the mold in the direction of arrow A as shown in FIGS. 8 and 10.

In an upper part of the LED package 10, injected resin flows as shown in FIG. 8 in which components in a lower part are shown in dotted lines for the sake of convenience.

First, resin generally flows toward both lateral ends of the body 102 in the rear half 102 of the body 102 about lead frames 140a and 140b. In the meantime, unlike the prior art as shown in FIG. 2, resin also flows as indicated by arrow A146 through the first resin flow grooves 146 of the lead frames 140a and 140b from the rear half 102b to the front half 102.

Resin flow A146 is formed by the first resin flow grooves 146. Comparing this with FIGS. 9 and 10, bottlenecks 110a are formed in a lower part of the lead frame 140 of FIG. 9 and in upper and lower parts of the lead frame 140 of FIG. 10. The bottlenecks 110a are formed since lateral edges of the lead frame are inserted into the body 102. However, the upper part of the lead frame 140 in FIG. 9 has the first resin flow groove 146, which forms a resin flow passage 10b allowing resin to flow through.

Thus, resin flows from the rear part 102b to the front part 102a of the body along the direction of arrow A146 to the end of the front part 102a. This as a result can overcome disadvantages of the prior art, in which resin fails to reach the central leading end of the upper or lower wall part 18, forming molding defects such as void.

In addition, resin flow in the direction of arrow A146 can create subsidiary resin flows or resin flow branches in the direction of arrow A'146. This can ensure efficient resin feeding across the entire upper and lower areas around the cavity C of the front half 102a.

On the other hand, the second resin flow grooves 148 are positioned at both lateral ends of the package body 102 so as to form resin flow passages as the first resin flow grooves 148 as above. Thus, the flow of resin from the body rear half 102b to the body front half 102a. This enables resin to flow more actively from the body rear part 102b to the body front part 102a, thereby ensuring more efficient resin flow across the entire area of the body 102a.

In the meantime, if the first resin flow holes 146 are sized too large, the LED chip 130 may directly contact the bottom 106 of the package body 102, which in turn may lower heat dissipation from the LED chip 130. This is not preferable particularly in case that the LED chip 130 generates large quantity of heat. Therefore, it is preferable that the first resin flow grooves 146 do not directly contact the LED chip 130. Furthermore, the lead frames 140 also function as a reflector that radiates light generated from the LED chip 130 to the outside through the cavity C. Too large holes in the lead frames 140 inside the cavity C may degrade the performance of the lead frames 140 as a reflector, potentially worsening light emitting efficiency of the LED package 100.

The resin flow grooves 146 and 148 in the lead frames 140 have advantages as follows:

Heat generated in response to the actuation of the LED chip 130 causes the lead frames 140 inside the LED package 100 along the length of the LED package 100. In this case, the lead frames 140 have an expansion coefficient different from those of the package body 102 and the encapsulant in the cavity C, such that the LED package 100 including the lead frames 140 may suffer from stress caused by the different expansion coefficients.

However, the lead frames 140 of the invention are configured to have a toothed structure with the resin flow grooves 146 and 148 so as to potentially absorb heat-induced expansion. Then, stress can be removed or at least minimized, and thus the lead frames 140 of the invention do no get loose or separate from the package body 102. This can advantageously prevent disconnections between the wires or the solder bumps and the lead frames or between the wires or the solder bumps and the LED chip as described above with reference to FIG. 5.

This advantage is available in particular considering that stress applied to the lead frames 140 under the heat increases gradually in proportion to the length of the lead frames 140 and the total length also increases gradually in proportion to the thickness reduction of the LED package 100.

Figure 11:
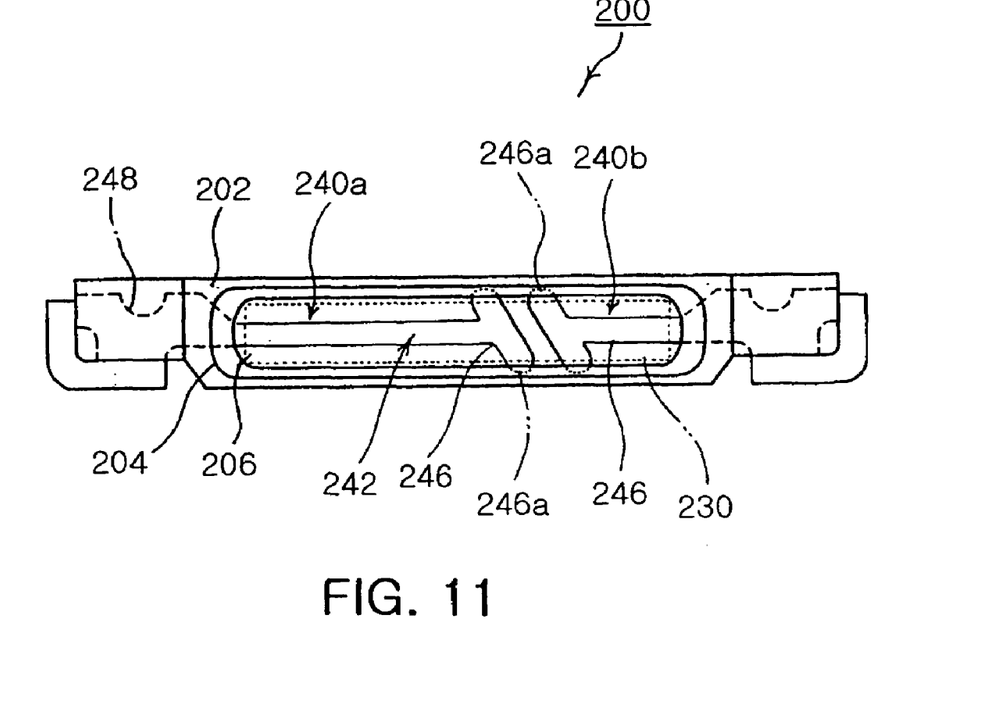
FIG. 11 is a front elevation view illustrating a side view LED package mounted with lead frames according to another embodiment of the invention.

With reference to FIG. 11, another embodiment having expanded first resin flow grooves will be explained. An LED package 200 shown in FIG. 11 has components substantially the same as those of the LED package 100 afore-described with reference to FIGS. 6 to 11 except for internal terminals 242 of lead frames 240a and 240b. Thus, corresponding components will be designated with reference signs by 200s, and will not be repeatedly described.

In FIG. 11, each of the lead frames 240a and 240b has a T-shaped internal terminal 242, with slit shaped openings 246 formed along both lateral sides of the internal terminal 242. The internal terminal 242 has fixed ends 246a inserted into a wall 204 to fix the internal terminal 242.

Preferably, the width of the internal terminal 242 is at least 80% of the thickness of the lead frames 240a and 240b. Besides, at least two pairs of fixed ends 246a may be formed if necessary.

This as a result can ensure larger resin flow passages with the openings 246, thereby achieving more efficient resin flow across upper and lower areas of the wall 204. This arrangement is necessary especially where resin has high viscosity. It is also preferable where resin has relatively large heat conductivity.

As described hereinbefore, the LED package of the invention has the lead frame structure designed to improve resin flow, and thus can ensure stability in the upper and lower wall parts around the cavity even if shaped@ extremely thin.

Furthermore, the LED package of the invention can ensure stability in internal electrical connection even under high temperature stress owing to the actuation of the LED.

While the present invention has been shown and described in connection with the preferred embodiments, it will be apparent to those skilled in the art that modifications and variations can be made without departing from the spirit and scope of the invention as defined by the appended claims.

What is claimed is:

1. A side view Light Emitting Diode (LED) package comprising:
    an LED chip;
    a strip-shaped lead frame having a toothed structure formed in a lateral edge thereof, the LED chip mounted on a surface of the lead frame; and
    an integral package body made of resin, and including a hollow front half having a cavity for housing the LED chip and a rear half bounding on the front half by the lead frame.

2. The side view LED according to claim 1, the toothed structure of the lead frame forms a resin flow passage promoting resin to flow from the rear half to the front half of the package body.

3. The side view LED according to claim 2, wherein the resin flow passage is configured to promote resin flow along a wall of the cavity from both lateral edges of the lead frame to the front half of the package body.

4. The side view LED according to claim 2, wherein the toothed structure of the lead frame further comprises a groove or hole that is buried in the package body.

5. The side view LED according to claim 2, wherein the toothed structure of the lead frame is formed by punching.

6. The side view LED according to claim 1, wherein the toothed structure of the lead frame comprises a groove formed in the lateral edge of the lead frame to expose a bottom of the cavity.

7. The side view LED according to claim 6, wherein the groove in the lateral edge of the lead frame is formed to such an extent that the bottom of the cavity does not directly contact the LED chip.

8. The side view LED according to claim 6, wherein the groove in the lateral edge of the lead frame is formed along a major part of the lead frame edge in the cavity to such an extent that a portion of the lead frame edge inserted into a wall of the cavity stably supports the lead frame.

9. The side view LED according to claim 6, wherein a remaining part of the lead frame in the cavity has a width of at least 80% of the thickness of the lead frame.

10. The side view LED according to claim 1, wherein the toothed structure of the lead frame comprises a groove or hole that is buried in the package body.

11. The side view LED according to claim 10, wherein the toothed structure of the lead frame comprises a groove caved into the lateral edge of the lead frame from an inside wall of the cavity.

* * * * *